US011609284B2

United States Patent
Tanabe

(10) Patent No.: US 11,609,284 B2
(45) Date of Patent: Mar. 21, 2023

(54) MAGNETIC SENSOR

(71) Applicant: TDK CORPORATION, Tokyo (JP)

(72) Inventor: Kei Tanabe, Tokyo (JP)

(73) Assignee: TDK CORPORATION, Tokyo (JP)

( * ) Notice: Subject to any disclaimer, the term of this patent is extended or adjusted under 35 U.S.C. 154(b) by 234 days.

(21) Appl. No.: 15/069,084

(22) Filed: Mar. 14, 2016

(65) Prior Publication Data

US 2016/0266218 A1 Sep. 15, 2016

(30) Foreign Application Priority Data

Mar. 12, 2015 (JP) .............................. JP2015-049730

(51) Int. Cl.
*G01R 33/00* (2006.01)
*G01R 33/09* (2006.01)

(52) U.S. Cl.
CPC ....... *G01R 33/093* (2013.01); *G01R 33/0005* (2013.01)

(58) Field of Classification Search
CPC combination set(s) only.
See application file for complete search history.

(56) References Cited

U.S. PATENT DOCUMENTS

| 6,014,023 | A | * | 1/2000 | Yokotani | ................ | G01R 33/09 |
| | | | | | | 324/207.21 |
| 9,983,273 | B2 | * | 5/2018 | Ogawa | .................. | G01R 33/09 |
| 2009/0322325 | A1 | * | 12/2009 | Ausserlechner | ....... | G01D 5/145 |
| | | | | | | 324/260 |
| 2010/0156405 | A1 | | 6/2010 | Furukawa et al. | | |
| 2012/0313631 | A1 | * | 12/2012 | Sterling | ................ | G01D 5/145 |
| | | | | | | 324/207.25 |
| 2014/0375311 | A1 | | 12/2014 | Ishii et al. | | |
| 2015/0177286 | A1 | * | 6/2015 | Fuji | ..................... | G01R 33/0005 |
| | | | | | | 324/144 |
| 2015/0345990 | A1 | * | 12/2015 | David | ................... | H01F 7/0278 |
| | | | | | | 324/207.2 |

FOREIGN PATENT DOCUMENTS

| JP | 5500785 B2 | 5/2014 |
| JP | 5597206 B2 | 10/2014 |
| WO | 2008/146809 A1 | 12/2008 |
| WO | 2013/118498 A1 | 8/2013 |

* cited by examiner

*Primary Examiner* — Minh Q Phan
(74) *Attorney, Agent, or Firm* — Oliff PLC

(57) ABSTRACT

The present invention relates to a magnetic sensor which can improve the detection precision of a weak magnetic field and can be downsized. A magnetic sensor is provided with a magnetic body changing the direction of a magnetic field input to a magnetoresistance effect element in the vicinity of the magnetoresistance effect element in which the resistance value changes according to the direction of the input magnetic field, the magnetic body has a mean for changing the direction of a magnetic field on the surface at a side where the magnetoresistance effect element is formed. The chamfer part of the magnetic body may be chamfered with a shape having at least one flat surface.

14 Claims, 11 Drawing Sheets

Magnetic flux in GMR element part from Embodiment 1

Configuration of the conventional sensor (plane invovling X-Z axis)

Configuration of the conventional sensor (plane invovling X-Y axis)

Magnetic flux in GMR element part from example of prior art

Magnetic flux in GMR element part from example of prior art

Configuration of the sensor from Embodiment 1 (plane invovling X-Z axis)

Configuration of the sensor from Embodiment 1 (plane invovling X-Y axis)

Configuration of the sensor from Embodiment 2 (plane invovling X-Z axis)

Configuration of the sensor from Embodiment 2 (plane invovling X-Y axis)

Magnetic flux in GMR element part from Embodiment 2 (plane involving X-Y axis)

Configuration of the sensor from Embodiment 3 (plane invovling X-Z axis)

Configuration of the sensor from Embodiment 3 (plane invovling X-Y axis)

Magnetic flux in GMR element part from Embodiment 3 (plane involving X-Y axis)

Configuration of the sensor from Embodiment 4 (plane invovling X-Z axis)

Configuration of the sensor from Embodiment 4 (plane invovling X-Y axis)

Magnetic flux in GMR element part from Embodiment 4 (plane involving X-Y axis)

Comparison on intensity of magnetic field H at magnetoresistance effect element part from Embodiment 4

MAGNETIC SENSOR

The present invention relates to a magnetic sensor, especially a magnetic sensor utilizing a magnetoresistance effect element.

BACKGROUND

A magnetic sensor capable of detecting the change of the magnetic field is developed as a measuring device and used in various applications such as the galvanometer, the magnetic encoder and the like. One example of such a magnetic sensor is disclosed in the following Patent Document 1 in which a GMR element (Giant Magneto Resistive element) is used as the element for detecting the change of the magnetic field. The GMR element is a kind of element in which the output resistance value changes according to the input magnetic field, and the change of the magnetic field to be detected can be measured based on the output resistance value.

As one example showing the specific configuration of the magnetic sensor where the GMR element is used, as described in Patent Document 1, four GMR elements are provided in the substrate to form a bridge circuit. As such, the change of the resistance value in the GMR element is detected by detecting the differential voltage in the bridge circuit, wherein the change of the resistance value in the GMR element is with the change of the magnetic field which becomes a detection object. In this respect, a sensor that is highly sensitive to the change of magnetic field has been provided.

In particular, as an element to detect the change of magnetic field, a GMR chip (the chip for detecting magnetic field) is provided in the magnetic sensor as disclosed in Patent Document 1, wherein the GMR chip utilizes the spin valve typed GMR elements (Giant Magneto Resistive element) in which the output resistance value changes depending on the direction of the input magnetic field. As such, each GMR element is magnetized fixedly in a specific direction in one surface so as to detect the magnetic field in the specified direction. Here, in order to downsize the GMR chip and also to lower the deviation in each resistance value, four GMR elements which have already formed the bridge circuit are provided on one GMR chip. Thus, all four GMR elements are magnetized fixedly in the same direction.

FIG. 1 and FIG. 2 illustrate the characteristic of the GMR element. First of all, the characteristic of the GMR element used in the present invention will be described with reference to FIG. 1 and FIG. 2. The GMR element is the GMR element (Giant Magneto Resistive element) made in the spin valve type in which output resistance value changes depending on the direction of the input magnetic field. As such, in FIG. 1 and FIG. 2, the relationship between the approach angle and the resistance value is shown, wherein the approach angle refers to the angle of magnetic field H relative to the GMR element.

In the example as shown in FIG. 1, GMR elements are formed on the upper surface of GMR chip 1. The GMR elements are arranged in such a manner that they are magnetized fixedly in the direction indicated by arrow A. Thus, the magnetic field in the direction as indicated by arrow A can be detected.

In FIG. 1, the GMR elements are arranged in magnetic field H that enters in the direction perpendicular to the form surface of the GMR elements. In this respect, the resistance value of the GMR element turns to "$R_0$" as shown in FIG. 2. In contrast, if the direction of magnetic field inclines, the incidence angle of magnetic field H relative to the GMR element surface deviates from the perpendicular direction with an angle of i.e., $-\Delta\theta$ or $+\Delta\theta$, as shown in FIG. 1 with dotted lines, wherein $\Delta$(Delta) refers to the variation. In this way, the GMR element is magnetized fixedly in one direction and the resistance value of the GMR element changes when the direction of the magnetic field changes with respect to said direction, as shown in FIG. 2. As such, the GMR element has the following characteristic. If the resistance value is defined as $R_0$ when the magnetic field enters in a perpendicular direction, the resistance value will have substantial change when the direction of the magnetic field H inclines with a tiny angle.

FIG. 3 and FIG. 4 show the configuration of the conventional magnetic sensor. When the magnetic field in one direction is detected by using a GMR chip where the bridge circuit as described above has been formed, magnetic body 21 which changes the direction of the magnetic field input to the GMR element is provided in the vicinity of the element forming part where the GMR elements in pair that are adjacent but not connected to each other in the bridge circuit are provided at almost symmetrical positions, as described in Patent Document 1.

Further, magnetic body 21 can change the external magnetic field in one direction into a different direction between the GMR elements. In this way, four GMR elements inside the bridge circuit are provided in such a manner that the magnetic field comes out in the direction in which the magnetization is fixed relative to one and comes out in the opposite direction relative to another one. As such, a high differential voltage is output from the bridge circuit, and the magnetic field in one direction can be detected in precision.

FIG. 5 is a schematic view showing the magnetic field H introduced to the GMR element parts 11 and 12 through magnetic body 21 as described in Patent Document 1. The magnetic field bends due to magnetic body 21, and the component of the magnetic field is generated in the GMR element parts 11 and 12 in the direction of the induced magnetic field (magnetic field component in the X-axis direction) and the resistance value of said GMR element changes. Thus, the sensor is provided which is highly sensitive to the change of the magnetic field. In addition, in the following description, the direction parallel to that where the GMR element is magnetized fixedly is defined as the X-axis direction, and the direction which is perpendicular to that where the GMR element is magnetized fixedly and also is located on the surface where the GMR elements are formed is defined as the Y-axis direction. Further, the direction perpendicular to the surface where the GMR elements are formed is defined as the Z-axis direction.

FIG. 6 is a view showing the surface involving the X-axis and the Y-axis in Patent Document 1, wherein said surface is taken from the schematic view showing magnetic field H introduced to GMR elements 11 and 12 through magnetic body 21. Magnetic field G is introduced from the external side of the view as shown in FIG. 6 to the internal side and is then bended with the effect from magnetic body 21 towards the direction where the magnetic induction occurs in GMR elements 11 and 12. In this way, the component of the magnetic field introduced in the direction where the magnetic induction occurs in GMR elements 11 and 12 (the magnetic field in the X-axis direction) is increased, and the resistance values of the GMR elements change as mentioned above.

Patent Document 2 has disclosed a sensor in which several magnetic bodies are provided for the magnetoresistance effect element to convert the external magnetic field in the vertical direction into magnetic field component in the horizontal direction so that the component of the magnetic field entering in the vertical direction is detected.

Patent Documents

Patent Document 1: JP-P5500785

Patent Document 2: JP-P5597206

SUMMARY

However, in the techniques disclosed in Patent Document 1 and Patent Document 2, the following problem exists. That is, in the detection of a weak magnetic field, the intensity of the magnetic field coming out of the element part is not sufficiently high.

Thus, it is necessary to improve the detection precision.

Thus, the objective of the present invention is to solve the technical problem mentioned above. That is, the present invention aims to improve the detection precision of the magnetic sensor with an easy and convenient configuration.

Here, the magnetic sensor according to one embodiment of the present invention, wherein a magnetic body which changes the direction of a magnetic field input to a magnetoresistance effect element is provided in the vicinity of the magnetoresistance effect element in which the resistance value changes according to the direction of the input magnetic field, and the magnetic body has at least one chamfer part where the corner part is chamfered in the cross-section shape on the surface parallel to the placement surface of the magnetoresistance effect element. In this way, the magnetic field to be detected is introduced to the magnetoresistance effect element efficiently to improve the detection precision.

Preferably, the magnetic body is chamfered with a shape having at least one flat surface. As such, the magnetic field to be detected can be introduced to the magnetoresistance effect element efficiently so as to improve the detection precision.

Preferably, the magnetic body is chamfered with a shape having at least one curved part. As such, the magnetic field to be detected can be introduced to the magnetoresistance effect element efficiently so as to improve the detection precision.

Further, the magnetic body is preferably the soft magnetic body.

According to the invention mentioned above, the detection precision of the magnetic sensor can be improved by introducing the magnetic field to be detected to the magnetoresistance effect element through the chamfer part of the magnetic body.

DETAILED DESCRIPTION OF EMBODIMENTS

The specific configuration in the present invention will be described in the following embodiments. Hereinafter, the basic configuration of the magnetic sensor in the present invention will be described in Embodiment 1, and the configuration of the magnetic sensor in the present invention to be specifically applied will be described in Embodiments 2 to 4.

The GMR element is described as an example of the magnetoresistance effect element, but the element involving the magneto-resistance effect can also be used, including the TMR element, AMR element and the like.

Embodiment 1

Figure 1:
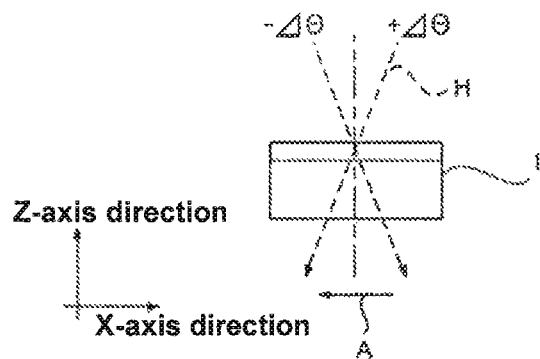
FIG. 1 is a view showing the configuration of the GMR chip.
Figure 2:
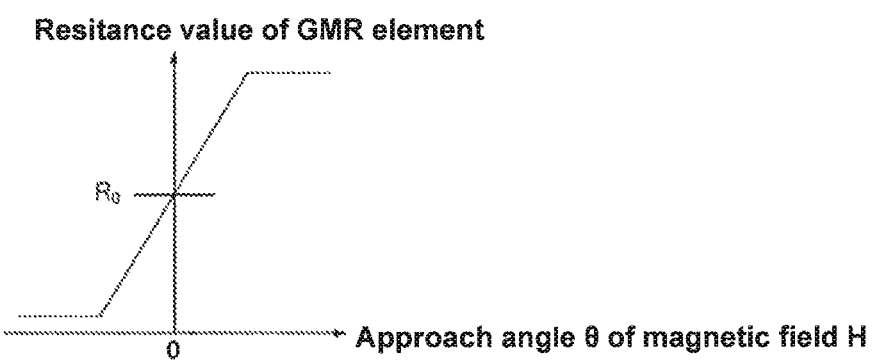
FIG. 2 is a diagram showing the characteristic of the GMR element.
Figure 3:
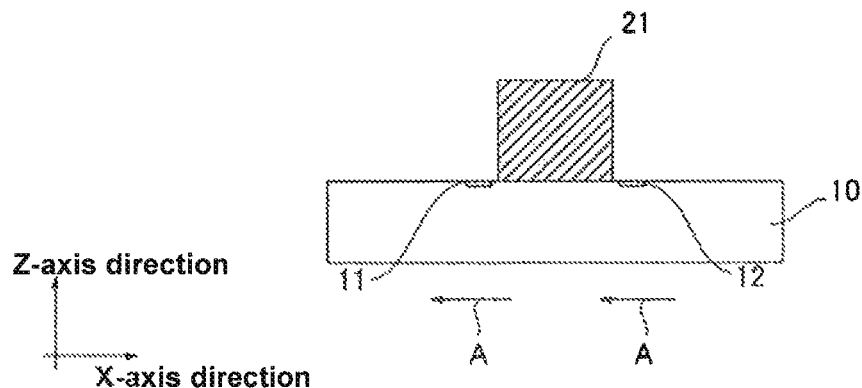
FIG. 3 is a view showing the configuration of the conventional magnetic sensor (the surface involving X-Z axis).
Figure 4:
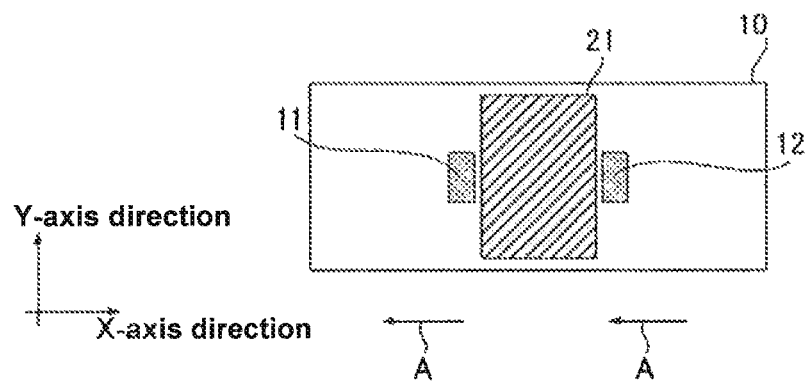
FIG. 4 is a view showing the configuration of the conventional magnetic sensor (the surface involving X-Y axis).
Figure 5:
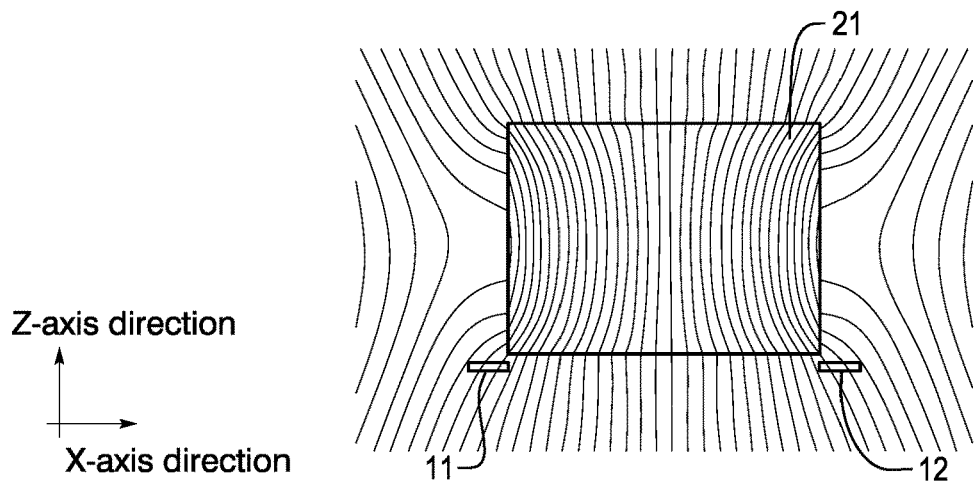
FIG. 5 is a schematic view showing the magnetic flux introduced to the GMR element part in the example of prior art (on the surface involving X-Z axis).
Figure 6:
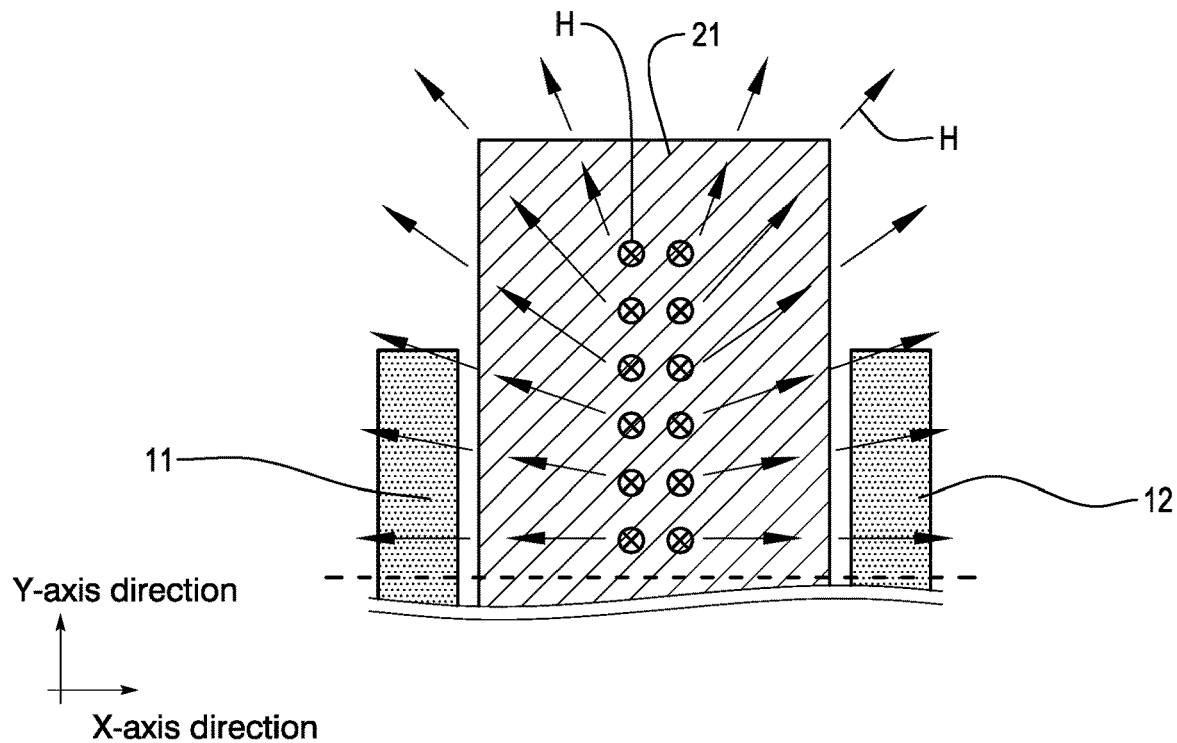
FIG. 6 is a schematic view showing the magnetic flux introduced to the GMR element part in the example of prior art (on the surface involving X-Y axis).
Figure 7:
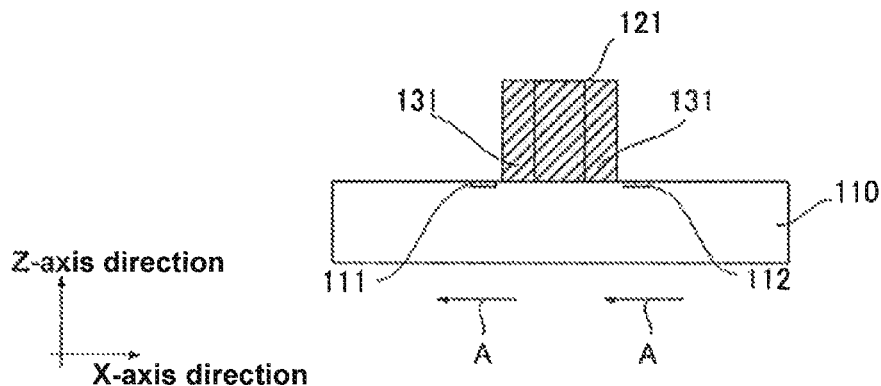
FIG. 7 is a view showing the configuration of the magnetic sensor in Embodiment 1 (on the surface involving X-Z axis).
Figure 8:
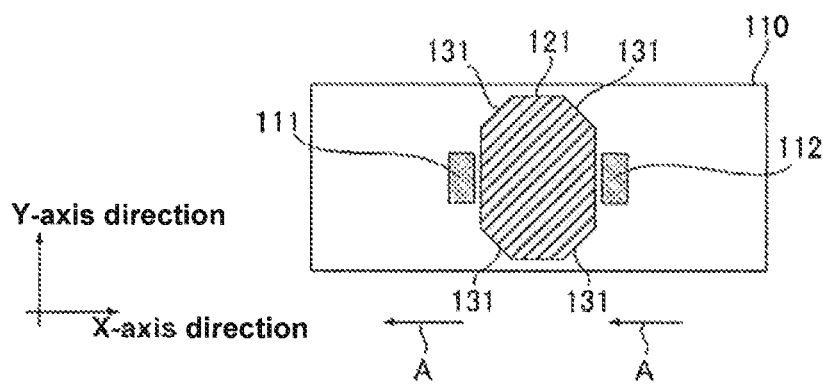
FIG. 8 is a view showing the configuration of the magnetic sensor in Embodiment 1 (on the surface involving X-Y axis).
Figure 9:
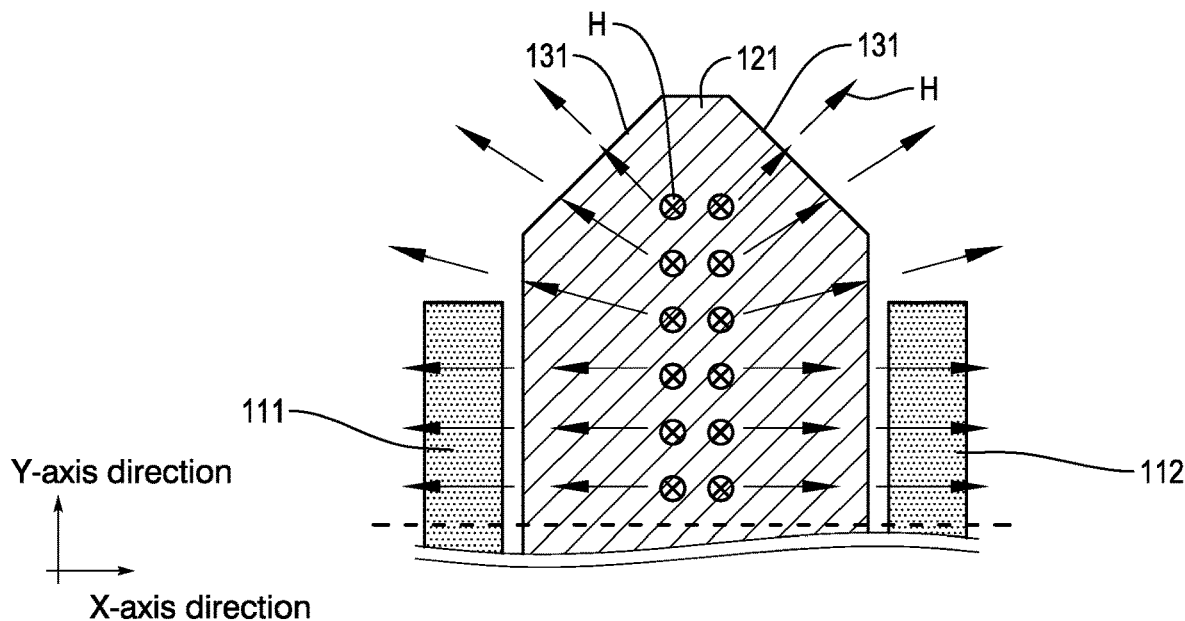
FIG. 9 is a schematic view showing the magnetic flux introduced to the GMR element part in Embodiment 1.
Figure 10:
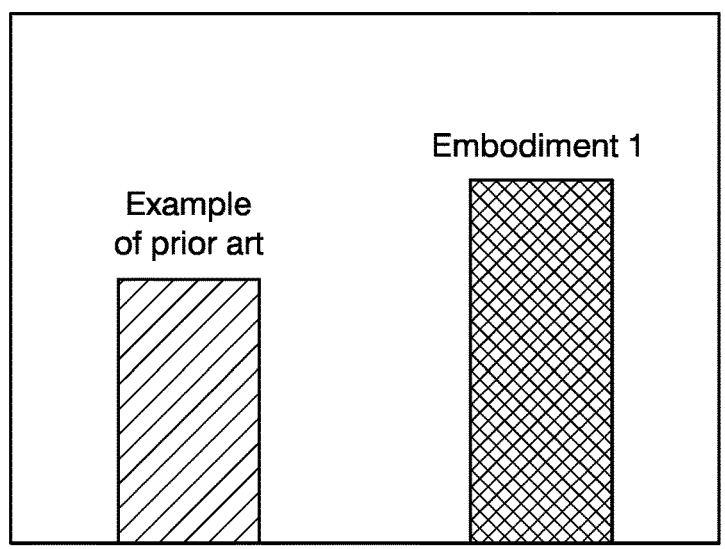
FIG. 10 shows the stimulation results in the example of prior art and Embodiment 1 about the intensity of the magnetic field at the magnetoresistance effect element part in the X-axis direction.

The first embodiment of the present invention will be described with reference to FIG. 7 to FIG. 10. FIG. 7 is a view showing the configuration of the magnetic sensor according to the present embodiment on the surface involving X-Z axis. FIG. 8 is a view showing the configuration of the magnetic sensor according to the present embodiment on the surface involving X-Y axis. FIG. 9 is a schematic view showing the magnetic field entering the GMR element part through the magnetic body in the present embodiment. FIG. 10 shows the stimulation results in the example of prior art and the present embodiment about the intensity of the magnetic field at the magnetoresistance effect element part in the X-axis direction.

[Configuration]

The shape of the soft magnetic body according to the present embodiment will be described with reference to FIG. 7 and FIG. 8. GMR elements 111 and 112 are formed in GMR chip 110. Further, these GMR elements form a bridge circuit. In the vicinity of the bridge circuit, magnetic body 121 changing the direction of the magnetic field input to the magnetoresistance effect element is disposed. In addition, on the cross-section involving X-Y axis, chamfer part 131 is disposed on the corner part of magnetic body 121.

Further, chamfer part 131 of magnetic body 121 preferably has one flat surface.

Magnetic body 121 is the soft magnetic body made of the material such as the ferrite material, the permalloy (Ni—Fe alloy), Sendust (Fe—Si—Al alloy) or the like. The material is not restricted as long as magnetic body 121 functions to change the direction of magnetic field H.

Further, magnetic body 121 is preferably composed of one component. However, as long as magnetic body 121 is capable of changing the direction of magnetic field H, the number of the components to constitute magnetic body 121 is not particularly restricted.

[Function]

Hereinafter, magnetic field H introduced to GMR element parts 111 and 112 through the configuration mentioned above will be described with reference to FIG. 9. Similar to that in the example of prior art, the magnetic field entering magnetic body 121 from the front external side of the figure in Z-axis direction is bended by magnetic body 121 and is introduced into the interior of magnetic body 121.

Magnetic field H introduced into the interior of magnetic body 121 is guided towards the GMR element disposing side by the chamfer shape in the vicinity of chamfer part 131 of magnetic body 121 and is then bended towards the direction where the magnetic induction occurs in the GMR element. With such a function, the component of magnetic field H in the X-axis direction is increased to improve the detection precision of the magnetic sensor, wherein the magnetic induction occurs in the X-axis direction in the GMR element.

With reference to FIG. 10, a simulation is performed to predict the intensity of magnetic field H introduced to GMR element parts 111 and 112 through the configuration mentioned above, and the result is described and compared against that from the example of prior art. It can be confirmed in Embodiment 1 that the intensity of magnetic field H introduced to GMR element parts 111 and 112 is increased compared to that in the example of prior art.

With the function mentioned above, the detection precision of the magnetic sensor can be improved by increasing the intensity of the magnetic field at the GMR element part.

Embodiment 2

Figure 11:
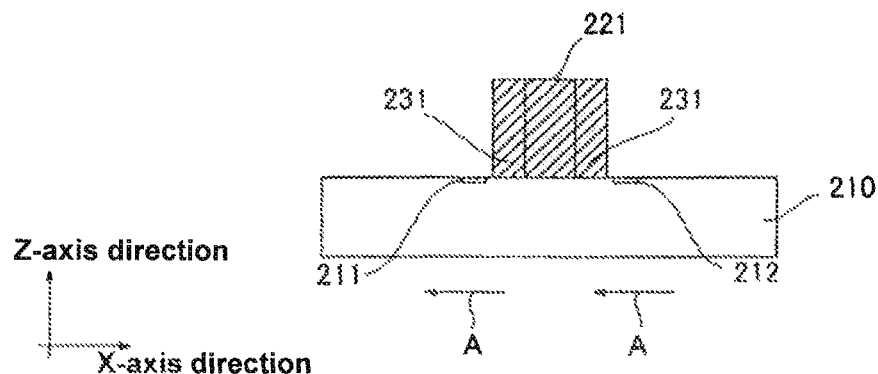
FIG. 11 is a view showing the configuration of the magnetic sensor in Embodiment 2 (on the surface involving X-Z axis).
Figure 12:
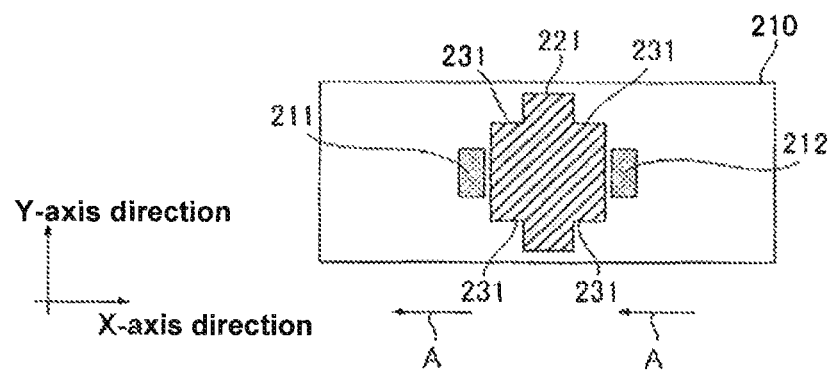
FIG. 12 is a view showing the configuration of the magnetic sensor in Embodiment 2 (on the surface involving X-Y axis).
Figure 13:
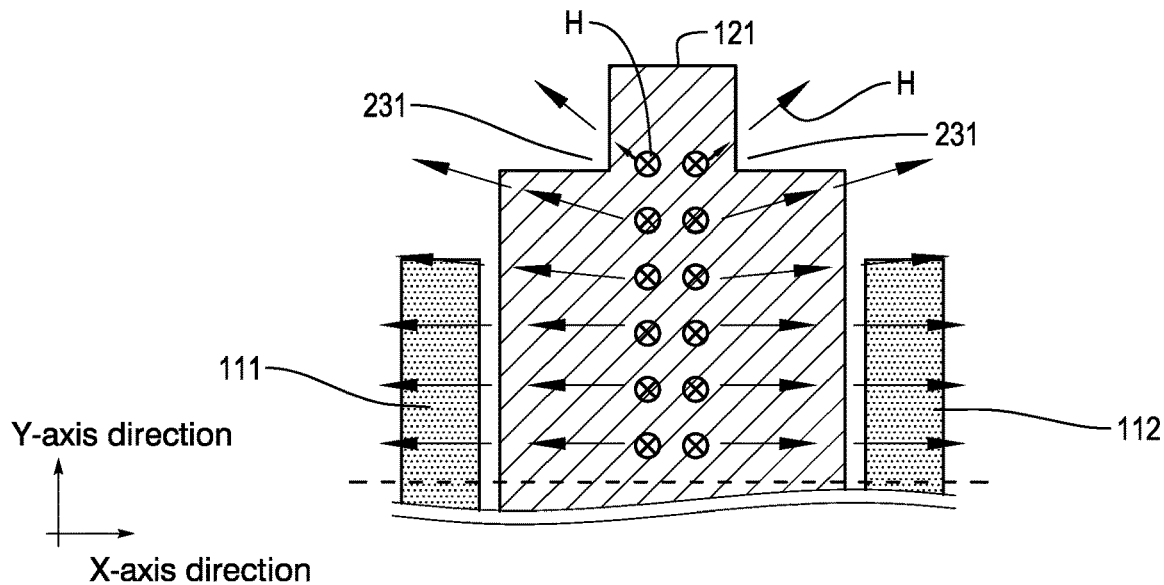
FIG. 13 is a schematic view showing the magnetic flux introduced to the GMR element part in Embodiment 2.
Figure 14:
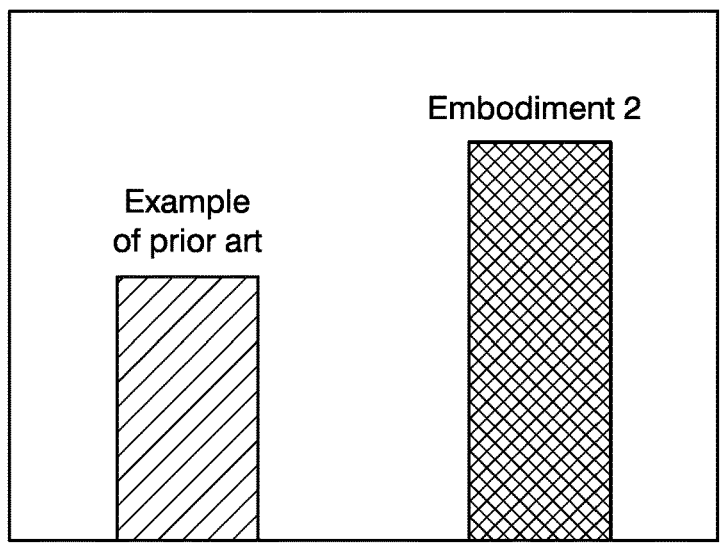
FIG. 14 shows the stimulation results in the example of prior art and Embodiment 2 about the intensity of the magnetic field at the magnetoresistance effect element part in the X-axis direction.

The second embodiment of the present invention will be described with reference to FIG. 11 to FIG. 14. FIG. 11 is a view showing the configuration of the magnetic sensor according to the present embodiment on the surface involving X-Z axis. FIG. 12 is a view showing the configuration of the magnetic sensor according to the present embodiment on the surface involving X-Y axis. FIG. 13 is a schematic view showing the magnetic field entering the GMR element part through the magnetic body in the present embodiment. FIG. 14 shows the stimulation results in the example of prior art and the present embodiment about the intensity of the magnetic field at the magnetoresistance effect element part in the X-axis direction.

[Configuration]

The shape of the soft magnetic body according to the present embodiment will be described with reference to FIG. 11 and FIG. 12. GMR elements 211 and 212 are formed in GMR chip 210. Further, these GMR elements form a bridge circuit. In the vicinity of the bridge circuit, magnetic body 221 changing the direction of the magnetic field input to the magnetoresistance effect element is disposed. In addition, on the cross-section involving X-Y axis, chamfer part 231 is disposed on the corner part of magnetic body 221.

Further, on the plane involving X-axis and Y-axis, the shape of chamfer part 231 of magnetic body 221 preferably has two flat surfaces. However, the shape of chamfer part 231 may have two or more flat surfaces as long as chamfer part 231 functions to change the direction of magnetic field H.

Magnetic body 221 is the soft magnetic body made of the material such as the ferrite material, the permalloy (Ni—Fe alloy), Sendust (Fe—Si—Al alloy) or the like. The material is not restricted as long as magnetic body 221 functions to change the direction of magnetic field H.

Further, magnetic body 221 is preferably composed of one component. However, as long as magnetic body 221 is capable of changing the direction of magnetic field H, the number of the components to constitute magnetic body 221 is not particularly restricted.

[Function]

Hereinafter, magnetic field H introduced to GMR element parts 211 and 212 through the configuration mentioned above will be described with reference to FIG. 13. Similar to that in the example of prior art, the magnetic field entering magnetic body 221 from the front external side of the figure in Z-axis direction is bended by magnetic body 221 and is introduced into the interior of magnetic body 221.

Magnetic field H introduced into the interior of magnetic body 221 is guided towards the GMR element disposing side by the chamfer shape in the vicinity of chamfer part 231 of magnetic body 221 and is then bended towards the direction where the magnetic induction occurs in the GMR element. With such a function, the component of magnetic field H in the X-axis direction is increased to improve the detection precision of the magnetic sensor, wherein the magnetic induction occurs in the X-axis direction in the GMR element.

With reference to FIG. 14, a simulation is performed to predict the intensity of magnetic field H introduced to GMR element parts 211 and 212 through the configuration mentioned above, and the result is described and compared against that from the example of prior art. It can be confirmed in Embodiment 2 that the intensity of magnetic field H introduced to GMR element parts 211 and 212 is increased compared to that in the example of prior art.

With the function mentioned above, the detection precision of the magnetic sensor can be improved by increasing the intensity of the magnetic field at the GMR element part.

Embodiment 3

Figure 15:
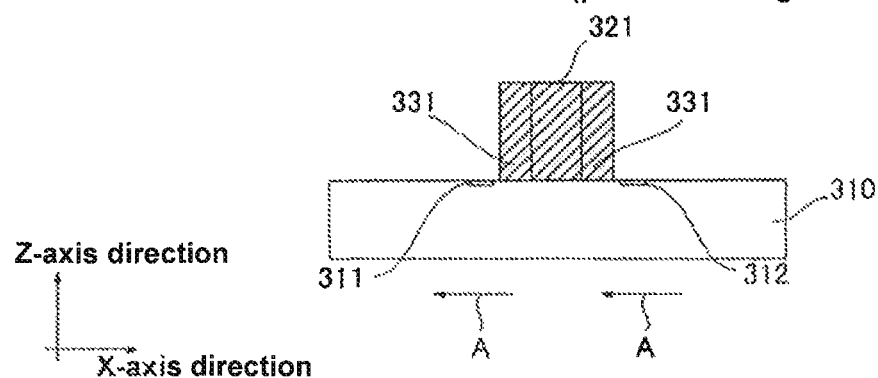
FIG. 15 is a view showing the configuration of the magnetic sensor in Embodiment 3 (on the surface involving X-Z axis).
Figure 16:
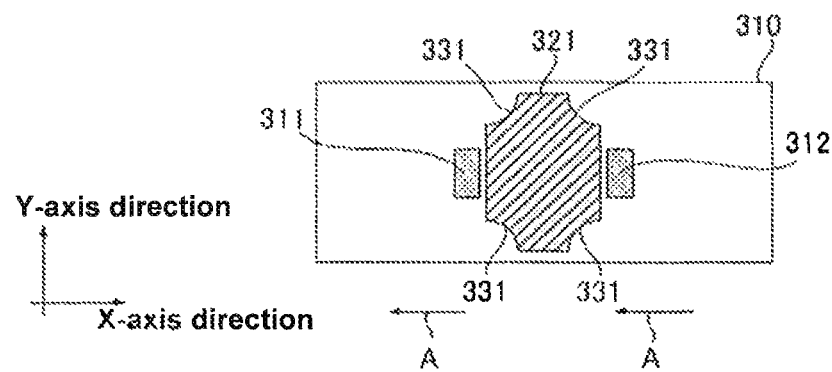
FIG. 16 is a view showing the configuration of the magnetic sensor in Embodiment 3 (on the surface involving X-Y axis).
Figure 17:
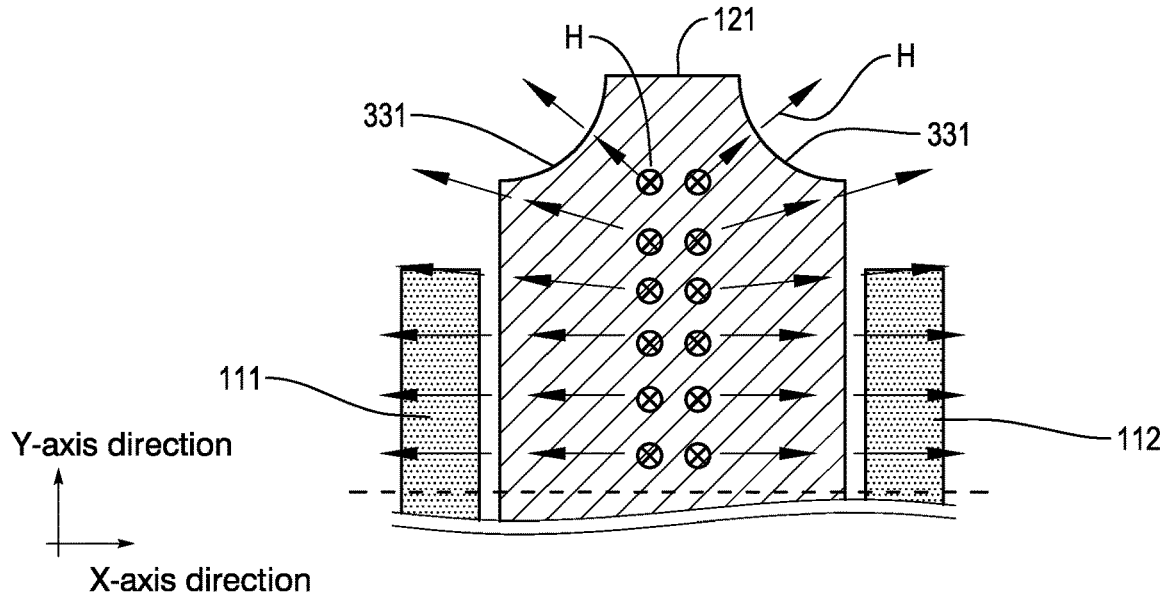
FIG. 17 is a schematic view showing the magnetic flux introduced to the GMR element part in Embodiment 3.
Figure 18:
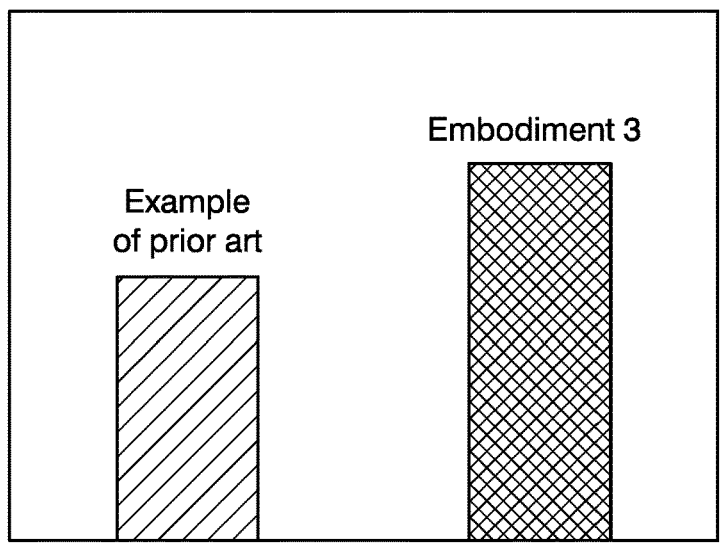
FIG. 18 shows the stimulation results in the example of prior art and Embodiment 3 about the intensity of the magnetic field at the magnetoresistance effect element part in the X-axis direction.

The third embodiment of the present invention will be described with reference to FIG. 15 to FIG. 18. FIG. 15 is a view showing the configuration of the magnetic sensor according to the present embodiment on the surface involving X-Z axis. FIG. 16 is a view showing the configuration of the magnetic sensor according to the present embodiment on the surface involving X-Y axis. FIG. 17 is a schematic view showing the magnetic field entering the GMR element part through the magnetic body in the present embodiment. FIG. 18 shows the stimulation results in the example of prior art and the present embodiment about the intensity of the magnetic field at the magnetoresistance effect element part in the X-axis direction.

[Configuration]

The shape of the soft magnetic body according to the present embodiment will be described with reference to FIG. 15 and FIG. 16. GMR elements 311 and 312 are formed in GMR chip 310. Further, these GMR elements form a bridge circuit. In the vicinity of the bridge circuit, magnetic body 321 changing the direction of the magnetic field input to the magnetoresistance effect element is disposed. In addition, on the cross-section involving X-Y axis, chamfer part 331 is disposed on the corner part of magnetic body 321.

Further, on the plane involving the X-axis and the Y-axis, chamfer part 331 of magnetic body 321 preferably has an arc like shape bulging towards the center direction of magnetic body 321. However, the arc like shape can be used for part or all of chamfer parts 331 as long as chamfer part 331 functions to change the direction of magnetic field H. Further, the arc like shape and the polygon like shape can be used in combination for chamfer part 331.

Magnetic body 321 is the soft magnetic body made of the material such as the ferrite material, the permalloy (Ni—Fe alloy), Sendust (Fe—Si—Al alloy) or the like. The material is not restricted as long as magnetic body 221 functions to change the direction of magnetic field H.

Further, magnetic body 321 is preferably composed of one component. However, as long as magnetic body 321 is capable of changing the direction of magnetic field H, the number of the components to constitute magnetic body 321 is not particularly restricted.

[Function]

Hereinafter, magnetic field H introduced to GMR element parts 311 and 312 through the configuration mentioned above will be described with reference to FIG. 17. Similar to that in the example of prior art, the magnetic field entering magnetic body 321 from the front external side of the figure in Z-axis direction is bended by magnetic body 321 and is introduced into the interior of magnetic body 321.

Magnetic field H introduced into the interior of magnetic body 321 is guided towards the GMR element disposing side by the chamfer shape in the vicinity of chamfer part 331 of magnetic body 321 and is then bended towards the direction where the magnetic induction occurs in the GMR element. With such a function, the component of magnetic field H in the X-axis direction is increased to improve the detection precision of the magnetic sensor, wherein the magnetic induction occurs in the X-axis direction in the GMR element.

With reference to FIG. 18, a simulation is performed to predict the intensity of magnetic field H introduced to GMR element parts 311 and 312 through the configuration mentioned above, and the result is described and compared against that from the example of prior art. It can be confirmed in Embodiment 3 that the intensity of magnetic field H introduced to GMR element parts 311 and 312 is increased compared to that in the example of prior art.

With the function mentioned above, the detection precision of the magnetic sensor can be improved by increasing the intensity of the magnetic field at the GMR element part.

Embodiment 4

Figure 19:
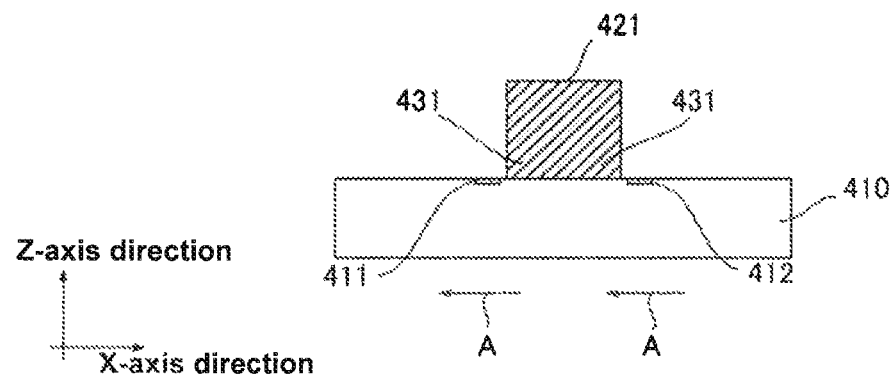
FIG. 19 is a view showing the configuration of the magnetic sensor in Embodiment 4 (on the surface involving X-Z axis).
Figure 20:
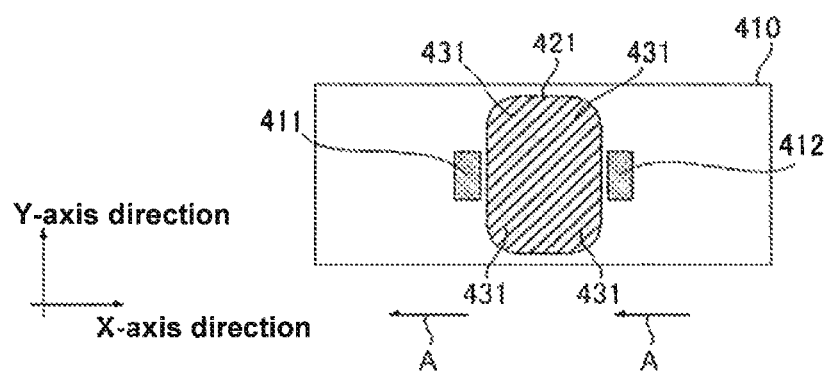
FIG. 20 is a view showing the configuration of the magnetic sensor in Embodiment 4 (on the surface involving X-Y axis).
Figure 21:
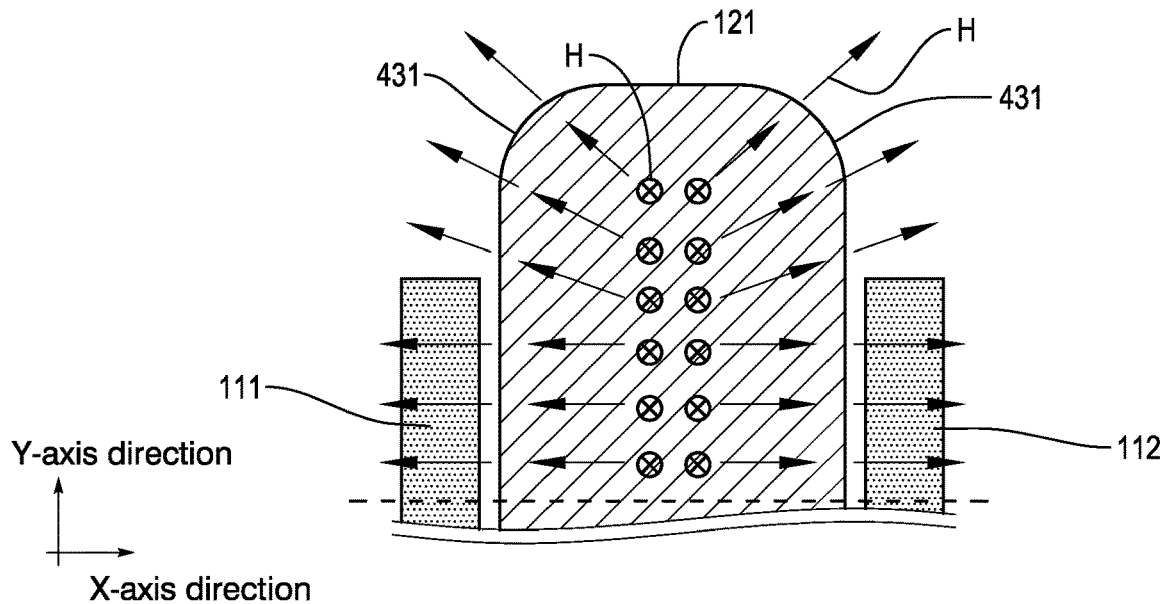
FIG. 21 is a schematic view showing the magnetic flux introduced to the GMR element part in Embodiment 4.
Figure 22:
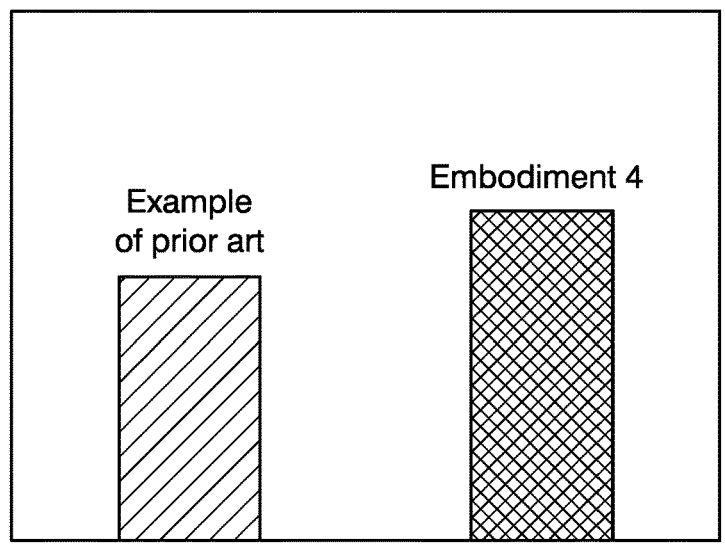
FIG. 22 shows the stimulation results in the example of prior art and Embodiment 4 about the intensity of the magnetic field at the magnetoresistance effect element part in the X-axis direction.

The fourth embodiment of the present invention will be described with reference to FIG. 19 to FIG. 22. FIG. 19 is a view showing the configuration of the magnetic sensor according to the present embodiment on the surface involving X-Z axis. FIG. 20 is a view showing the configuration of the magnetic sensor according to the present embodiment on the surface involving X-Y axis. FIG. 21 is a schematic view showing the magnetic field entering the GMR element part through the magnetic body in the present embodiment. FIG. 22 shows the stimulation results in the example of prior art and the present embodiment about the intensity of the magnetic field at the magnetoresistance effect element part in the X-axis direction.

[Configuration]

The shape of the soft magnetic body according to the present embodiment will be described with reference to FIG. 19 and FIG. 20. GMR elements 411 and 412 are formed in GMR chip 410. Further, these GMR elements form a bridge circuit in the vicinity of the bridge circuit, magnetic body 421 changing the direction of the magnetic field input to the magnetoresistance effect element is disposed. In addition, on the cross-section involving X-Y axis, chamfer part 431 is disposed on the corner part of magnetic body 421.

Further, on the plane involving the X-axis and the Y-axis, chamfer part 431 of magnetic body 421 preferably has an arc like shape bulging towards the outside direction of magnetic body 421. However, the arc like shape can be used for part or all of chamfer parts 431 as long as chamfer part 431 functions to change the direction of magnetic field H. Further, the arc like shape and the polygon like shape can be used in combination for chamfer part 431.

Magnetic body 421 is the soft magnetic body made of the material such as the ferrite material, the permalloy (Ni—Fe alloy), Sendust (Fe—Si—Al alloy) or the like. The material is not restricted as long as magnetic body 221 functions to change the direction of magnetic field H.

Further, magnetic body 421 is preferably composed of one component. However, as long as magnetic body 421 is capable of changing the direction of magnetic field H, the number of the components to constitute magnetic body 421 is not particularly restricted.

[Function]

Hereinafter, magnetic field H introduced to GMR element parts 411 and 412 through the configuration mentioned above will be described with reference to FIG. 21. Similar to that in the example of prior art, the magnetic field entering magnetic body 421 from the front external side of the figure in Z-axis direction is bended by magnetic body 421 and is introduced into the interior of magnetic body 421.

Magnetic field H introduced into the interior of magnetic body 421 is guided towards the GMR element disposing side by the chamfer shape in the vicinity of chamfer part 431 of magnetic body 421 and is then bended towards the direction where the magnetic induction occurs in the GMR element. With such a function, the component of magnetic field H in the X-axis direction is increased to improve the detection precision of the magnetic sensor, wherein the magnetic induction occurs in the X-axis direction in the GMR element.

With reference to FIG. 22, a simulation is performed to predict the intensity of magnetic field H introduced to GMR element parts 411 and 412 through the configuration mentioned above, and the result is described and compared against that from the example of prior art. It can be confirmed in Embodiment 4 that the intensity of magnetic field H introduced to GMR element parts 411 and 412 is increased compared to that in the example of prior art.

With the function mentioned above, the detection precision of the magnetic sensor can be improved by increasing the intensity of the magnetic field at the GMR element part.

INDUSTRIAL APPLICATION

The present invention can be applied to various measuring devices such as the magnetic sensor, the galvanometer and the encoder. Thus, the present invention can be utilized in the industry.

DESCRIPTION OF REFERENCE NUMERALS

1 GMR chip
10 GMR chip in example of prior art
11, 12 element disposing part in example of prior art
21 magnetic body in example of prior art
110 GMR chip in Embodiment 1
111, 112 element disposing part in Embodiment 1
121 magnetic body in Embodiment 1
131 chamfer part of magnetic body in Embodiment 1
210 GMR chip in Embodiment 2
211, 212 element disposing part in Embodiment 2
221 magnetic body in Embodiment 2
231 chamfer part of magnetic body in Embodiment 2
310 GMR chip in Embodiment 3
311, 312 element disposing part in Embodiment 3
321 magnetic body in Embodiment 3
331 chamfer part of magnetic body in Embodiment 3
410 GMR chip in Embodiment 4
411, 412 element disposing part in Embodiment 4
421 magnetic body in Embodiment 4
431 chamfer part of magnetic body in Embodiment 4
A fixed direction of magnetization
H magnetic field

What is claimed is:

1. A magnetic sensor for detecting an intensity of a magnetic field comprising:
a magnetoresistance effect element placed on a placement surface; and
a magnetic body (1) placed on the placement surface and spaced from the magnetoresistance effect element when viewed in a direction perpendicular to the placement surface such that the magnetoresistance effect element is located outside the periphery of the magnetic body when viewed in the direction perpendicular to the placement surface and (2) that has a polygon shape with at least one chamfered corner in a cross-section parallel to the placement surface, wherein
the magnetic body changes the direction of an input magnetic field input to the magnetoresistance effect element,
a resistance value of the magnetoresistance effect element changes according to the direction of the input magnetic field, and
the magnetoresistance effect element and the magnetic body are configured and positioned relative to each other such that the magnetic field enters the magnetic body in a direction transverse to the placement surface and is guided out of the magnetic body and to the magnetoresistance effect element such that the at least one chamfered corner causes the input magnetic field in the vicinity of the at least one chamfered corner to bend towards a direction in which magnetic induction occurs in the magnetoresistance effect element to increase the intensity of the input magnetic field.

2. The magnetic sensor according to claim 1, wherein, the magnetic body is a soft magnetic body.

3. The magnetic sensor according to claim 1, wherein the magnetic body does not overlap any part of the magnetoresistance effect element when viewed in the direction perpendicular to the placement surface.

4. The magnetic sensor according to claim 1, wherein the magnetic body has a rectangular shape with four corners.

5. A magnetic sensor for detecting an intensity of a magnetic field comprising:
a pair of spaced magnetoresistance effect elements placed on a placement surface; and
a magnetic body positioned between the pair of magnetoresistance effect elements when viewed in a direction perpendicular to the placement surface, the magnetic body not overlapping any part of the magnetoresistance effect elements when viewed in the direction perpendicular to the placement surface, wherein
the magnetic body changes the direction of an input magnetic field input to the magnetoresistance effect elements,
resistance values of the magnetoresistance effect elements change according to the direction of the input magnetic field,
the magnetic body has a polygon shape with at least one chamfered corner in a cross-section parallel to the placement surface, and
the magnetoresistance effect elements and the magnetic body are configured and positioned relative to each other such that the magnetic field enters the magnetic body in a direction transverse to the placement surface and is guided out of the magnetic body and to the magnetoresistance effect elements such that the at least one chamfered corner causes the input magnetic field in the vicinity of the at least one chamfered corner to bend towards a direction in which magnetic induction occurs in the magnetoresistance effect elements to increase the intensity of the input magnetic field.

6. The magnetic sensor according to claim 5, wherein the chamfered corner of the magnetic body constitutes a flat surface extending in the direction perpendicular to the placement surface.

7. The magnetic sensor according to claim 5, wherein the chamfered corner of the magnetic body constitutes a concave surface extending in the direction perpendicular to the placement surface.

8. The magnetic sensor according to claim 5, wherein, the magnetic body is a soft magnetic body.

9. The magnetic sensor according to claim 6, wherein, the magnetic body is a soft magnetic body.

10. The magnetic sensor according to claim 7, wherein, the magnetic body is a soft magnetic body.

11. The magnetic sensor according to claim 5, wherein the magnetic body has a rectangular shape with four corners in the cross-section.

12. The magnetic sensor according to claim 5, wherein all corners of the magnetic body are chamfered corners.

13. The magnetic sensor according to claim 5, wherein the magnetic body has a plurality of corners formed by side faces and all of the corners are other than a 90° corner formed by two of the side faces.

14. The magnetic sensor according to claim 5, wherein:
  the magnetic body has first and second opposing side surfaces; and
  the first side surface faces a first of the pair of spaced magnetoresistance effect elements and the second side surface faces a second of the pair of spaced magnetoresistance effect elements.

* * * * *